United States Patent [19]

Lee

[11] Patent Number: 5,933,376
[45] Date of Patent: Aug. 3, 1999

[54] SEMICONDUCTOR MEMORY DEVICE WITH ELECTRICALLY PROGRAMMABLE REDUNDANCY

[75] Inventor: Kang Woo Lee, Allentown, Pa.

[73] Assignee: Lucent Technologies Inc., Murray Hill, N.J.

[21] Appl. No.: 08/808,150

[22] Filed: Feb. 28, 1997

[51] Int. Cl.⁶ ........................................... G11C 7/00
[52] U.S. Cl. .................. 365/200; 365/225.7; 365/230.06
[58] Field of Search ................................ 365/200, 225.7, 365/230.06

[56] References Cited

U.S. PATENT DOCUMENTS

| | | | |
|---|---|---|---|
| 5,586,075 | 12/1996 | Miwa .................................. | 365/200 X |
| 5,596,542 | 1/1997 | Sugibayashi et al. ............... | 365/200 X |
| 5,610,865 | 3/1997 | Shin et al. ............................ | 365/200 |
| 5,617,364 | 4/1997 | Hatakeyama ....................... | 365/200 |
| 5,696,723 | 12/1997 | Tukahara ............................ | 365/200 |
| 5,703,817 | 12/1997 | Shiratake et al. .................. | 365/200 |
| 5,708,612 | 1/1998 | Abe ..................................... | 365/200 |

*Primary Examiner*—Do Hyun Yoo
*Attorney, Agent, or Firm*—Darby & Darby

[57] ABSTRACT

An integrated circuit having a memory which includes an array of data storage cells is provided with a redundant array and a signal-directing circuit. A row or column signal for a defective cell, if present, as well as each successively higher row or column signal, is directed to sequentially higher address locations in the array to thereby avoid the defective cell address location. The last row or column signal is directed to the address location of the redundant array. A fuse is preferably associated with each row or column signal which may be selectively melted to direct the row or column signals. The array can be logically divided into subarrays each having an associated redundant array so that defects in each subarray can be accommodated.

14 Claims, 5 Drawing Sheets

SEMICONDUCTOR MEMORY DEVICE WITH ELECTRICALLY PROGRAMMABLE REDUNDANCY

TECHNICAL FIELD

This invention relates to redundancy schemes for random access semiconductor memories and, more particularly, to an electrically programmable redundancy scheme.

BACKGROUND OF THE INVENTION

The use of spare components to replace defective components on semiconductor integrated circuit chips, generally referred to as "redundancy," has been increasingly utilized in recent years. The yield of good chips from a given wafer is strongly influenced by the size and number of defects that occur on the wafer. Such defects include defects in the silicon semiconductor crystal material that forms the substrate, as well as defects in oxide layers and conductors. Defects have become increasingly significant as the size of the individual components (that is the transistors, conductors, storage capacitors, resistors, and other components) becomes smaller relative to the size of the defects, and also as the overall area of the chip increases; both effects tending to increase the severity of the defect problem.

Fortunately, techniques have been developed to isolate defective portions of a circuit and substitute spare portions. Typical are the schemes described in U.S. Pat Nos. 3,753,235, 3,753,244 and 4,047,163 which require considerable additional circuitry. The techniques of the '235 and '244 patents provide a defective-word address store and a comparator circuit which disables a defective line of cells in an addressable array and directs signals for that store to an extra line of cells. The '244 stores the address of a defective cell by selectively open-circuiting wire links (fuses) of a read only memory connected to the comparator circuit using a bias current. The '235 stores the defective-cell address by grounding certain inputs of the comparator circuit. The '163 patent discloses a technique for substituting individual storage cells from a redundant array in place of a particular defective cell in the array. The technique of the '163 patent includes a storage means such as a programmed logic array which stores the row and column address location of each defective cell. This storage means sends an inhibit signal to inhibit normal cell selection and instead cause the selection of a redundant cell.

In U.S. Pat. No. 4,228,528 of Cenker et al. fusible links are melted using a laser beam to thereby disconnect a defective row or column of memory cells. This technique imposes minimum feature geometry requirements on the fusible links and further requires that the fusible links be physically spaced (isolated) from sensitive circuitry (e.g., the memory cells and logic) to avoid damage to surrounding circuitry by the laser beam. Practical application of such a technique would limit workers from reducing the surface dimensions of the fusible links along with the surrounding circuitry, in other words, would limit the "scalability" of such a redundant circuit technique. Moreover, multiple links must be cut to encode a spare row or column as a replacement for a particular row or column. Further, the laser vaporization requires extra processing steps including etching a window in a coating layer and subsequently closing the window.

However, the '528 patent recognizes certain considerations which are important for a defect-tolerant memory. In addition to the considerations identified in the '528 patent, an important consideration not heretofore adequately addressed in the art is whether the circuitry which enables the inclusion of a redundant array can be scaled along with the memory circuit and surrounding circuitry. Moreover, such circuitry should be implemented on the row or column pitch, that is, parallel to either the rows or columns of the cell array. Furthermore, the programming by which a redundant array is substituted for a defective array should be virtually program free and not impact on the speed of the memory. The present invention addresses these and other issues.

OBJECTS AND SUMMARY OF THE INVENTION

An integrated circuit including a memory according to my invention includes an array of data storage cells, a redundant array, and a signal-directing circuit which directs row or column signals, as well as each successively higher row or column signal, except for the last row or column signal, to sequentially higher address locations in the array. The last row or column signal is instead directed to the address location of the redundant array. The redundancy scheme of my invention has a fuse associated with each row or column signal which may be selectively melted to direct that row or column signal and higher ones to the next sequential address locations in the array.

My invention can also be realized in applications in which the memory storage cells comprises a plural cell arrays. In this situation, a defective cell which may be associated with one of the cell arrays may be repaired by utilizing a redundant array associated with that cell array. The plural cell arrays are subarrays that together comprise the required number of storage cells, and are configured to be logically addressed by certain bits assigned for the rows or columns. The plural cell arrays may be physically formed as a single array.

BRIEF DESCRIPTION OF THE DRAWINGS

The foregoing and other features and advantages of the present invention will be more readily apparent from the following detailed description when read in conjunction with the accompanying drawings; wherein.

DETAILED DESCRIPTION

Figure 1:
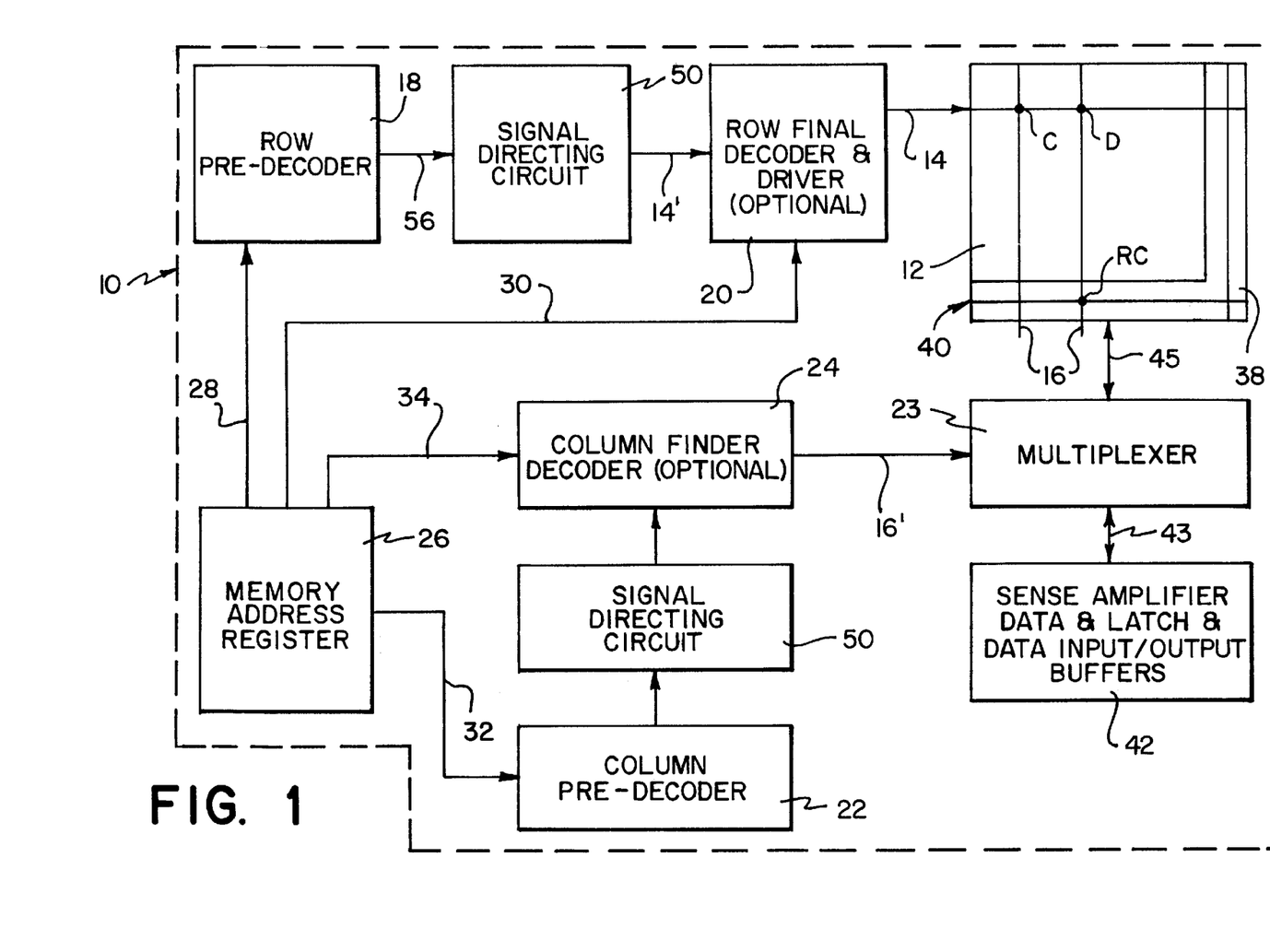
FIG. 1 shows in simplified block diagram form the layout of the portions of a memory chip according to the invention.

By way of overview and introduction, FIG. 1 shows a memory chip 10 in which a plurality of memory cells are arranged in a two-dimensional array 12 of rows and columns, each cell being accessed by signals on a row conductor 14, usually termed the "word line," and by signals on a column conductor 16, usually termed the "bit line." In familiar fashion, a particular cell C is accessed for reading or writing by applying a suitable voltage to the unique combination of individual row and column conductors accessing such cell, that is, by applying logic-high row and column signals on the bit and word lines which meet at the address location of such cell. The particular cell to be accessed in an arbitrarily large memory chip 10 is identified by its n-bit address. For example, a cell in a one megabit memory chip 10 is accessed by way of a 20-bit address ($2^{20}$=1,048,576 cells) whereas a cell in a one kilobit memory chip is accessed by way of a 10-bit address ($2^{10}$=1,024 cells). The n-bit address is decoded in conventional manner to provide row and column signals which may then be applied to the inputs of the array 12. An arbitrary number of bits may be assigned for generating the row and column signals. The number of rows and columns in a memory chip is dictated, in part, from layout considerations and space constraints on the chip which form no part of the present invention. Regardless of the layout, an n-bit address is decoded into row and column signals on the word lines 14 and bit lines 16, respectively, which together access a particular cell C in the cell array.

The n-bit address is decoded by row decoders 18, 20 and column decoders/multiplexers 22, 24. As known in the art, the decoders comprise a parallel group of metal oxide semiconductor (MOS) address decoding transistors, one for each digit of the address to be decoded. In conventional manner, a pre-decoder may be used to decode the most significant address bits assigned to the rows and columns, while a second decoder is used to decode the less significant address bits. In FIG. 1, an n-bit address is supplied by a memory address register (MAR) 26, which may be on-board or separate from (as shown) the memory 10, to pre- or first decoders 18 and 22 and final- or second decoders 20 and 24. In the embodiment of this figure, the most significant row bits (R-MSB) are provided to the decoder 18 on lines 28 while the less significant row bits (R-LSB) are provided to the decoder 20 on lines 30 and the most significant column bits (C-MSB) are provided to the decoder 22 on lines 32 while the less significant column bits (C-LSB) are provided to the decoder 24 on lines 34.

As a result of material or manufacturing error, one or more storage cells C in the manufactured cell array 12 may be defective. This may be detected on a wafer or in a packaged device by writing to each cell in the array 12 and reading the information back. If the bit read back does not match what was written, a defective cell D is present. This procedure may be performed using, for example, commercially available chip-testing instruments from companies such as Teradyne, Inc., Boston, Mass. A defective cell D, if not compensated for, will corrupt the memory chip 10 and thereby reduce the yield of the manufacturing facility. However, yield may be significantly improved when a redundant cell RC is substituted for the defective cell D. Yield improvement of between five and forty percent is presently expected for embedded memory devices, depending on their size.

In accordance with one application of the invention, the cell array 12 is augmented beyond its addressable size 12 by a redundant array 40 which includes either rows of redundant addressable storage cell locations 38, columns of redundant addressable storage cell locations 38, or both. Preferably, the redundant array 40 is physically contiguous to the cell array 12. The cells of the redundant array 40 are preferably addressed via row or column signals on word lines 14 or bit lines 16, respectively, in the same manner as the array 12. The redundant array 40 is only called upon for storing information when there is a defect in a given row or column K of the cell array 12. In other words, only when there exists a defective storage cell D in a particular row K will a row of redundant cells RC be substituted, or, when the defective storage cell D is in a particular column, will a column of redundant cells RC be substituted. Each of the redundant cells RC is preferably identical to the cells C in the cell array 12.

The data stored in the arrays 12 and 40 are provided as column signals over the column conductors (bit lines) 16. The decoders 24, 22 generate input signals to multiplexer 23 to select particular column signals from the row that has been addressed. During a read operation, the selected signals from the multiplexer 23 are electrically connected by conductors 43 to circuits 42 where they are amplified and latched. The latched data is then available for use with on-board or external components, for example, a microprocessor or a digital signal processor. During a write operation, data in a buffer of the circuits 42 are provided to the array 40 by way of conductors 43, 45 using the same addressing scheme.

A signal-directing circuit 50 which directs a row or column signal K to the redundant array address locations 40 instead of address locations in the array may be interposed between either the row decoder 18 and the array 12, the column decoder 22 and the array 12, or both as shown in FIG. 1.

Figure 2A:
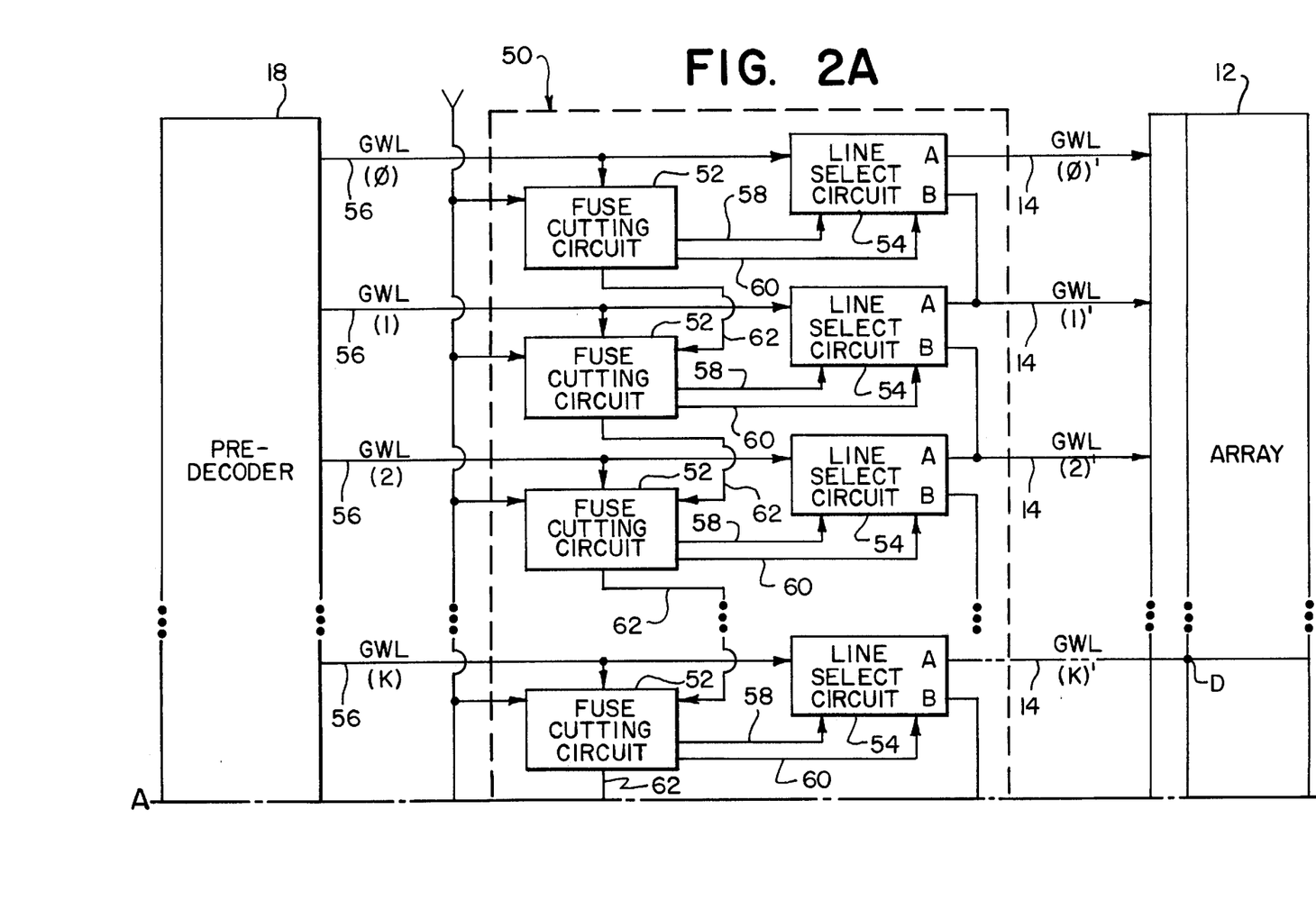
FIG. 2A shows in simplified block diagram form the layout of an application of a signal-directing circuit of the present invention connected between a decoding circuit, a conventional cell array, and a redundant array.
Figure 2B:
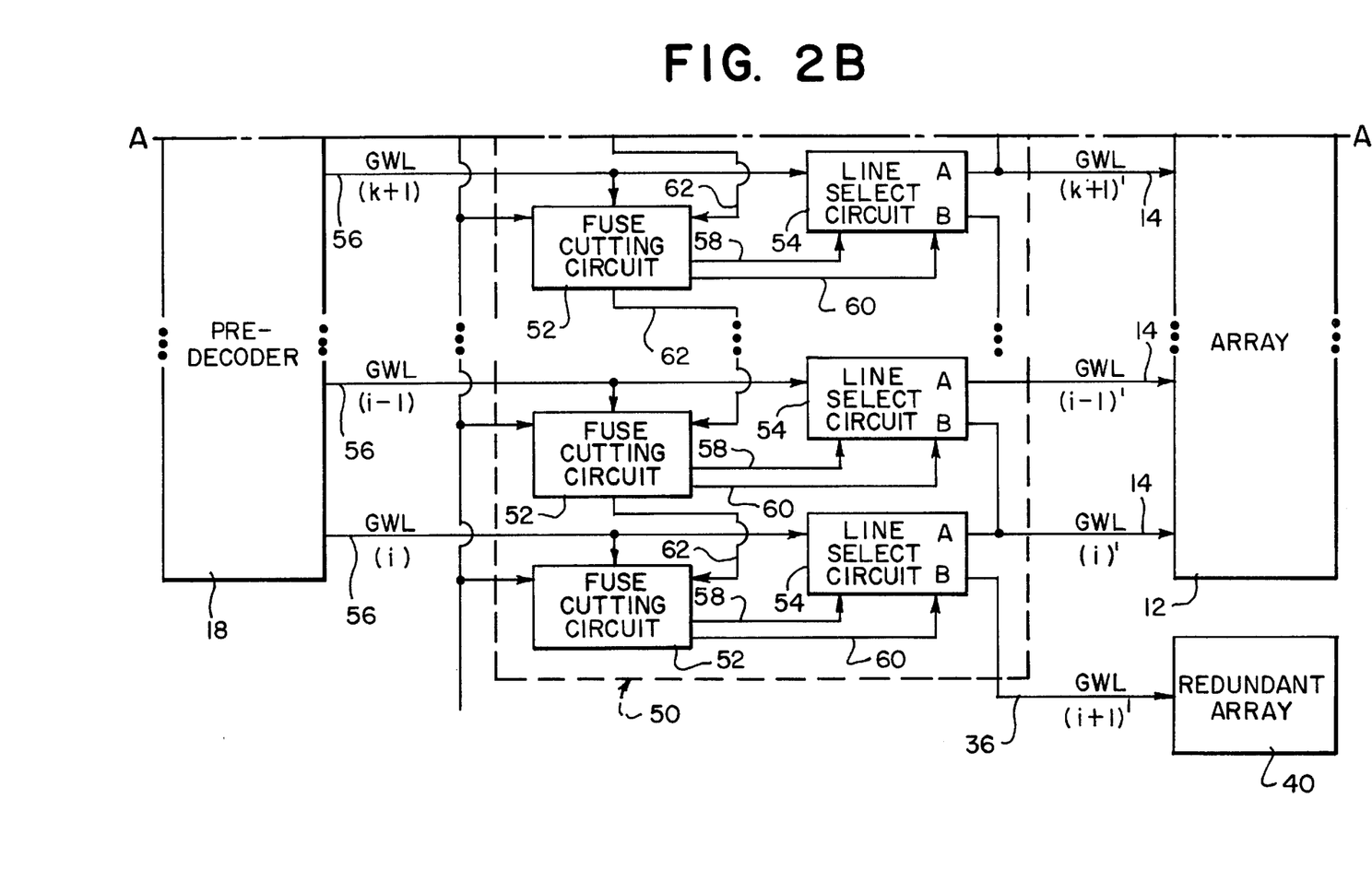
FIG. 2B shows the simplified block diagram of FIG. 2A connected along match lines A—A.
Figure 3:
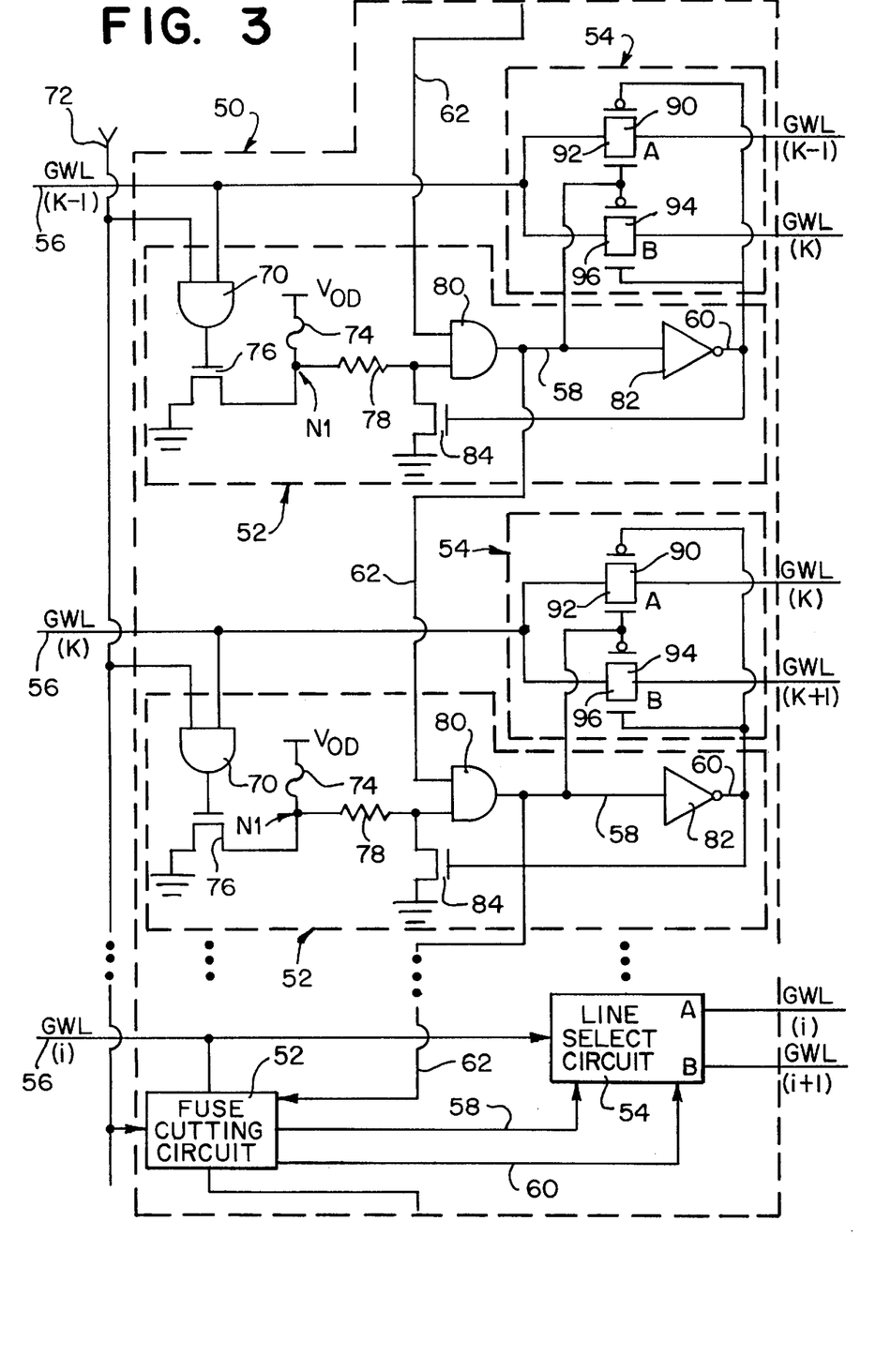
FIG. 3 shows in both circuit schematic and simplified block diagram forms an application of the signal-directing circuit of the present invention.

With reference now to FIGS. 2A, 2B and 3, the signal-directing circuit 50 according to a preferred embodiment includes a fuse-cutting circuit 52 and a line-select circuit 54 (shown in detail in FIG. 3). These circuits are designed for directing row or column signals to certain address locations. FIGS. 2A, 2B and 3 illustrate an application in which the signal-directing circuit 50 directs the row signals to sequentially higher address locations in the cell array 12 and to locations in the redundant array 40. A substantially similar, if not identical, circuit 50 may be provided for directing column signals to sequentially higher address locations in the cell array 12 and to locations in the redundant array 40.

As shown in FIGS. 2A and 2B the pre-decoder 18 decodes the n-bit address into row signals (global word lines (GWLs)) provided on outputs 56. Conventionally, the outputs 56 supply row signals 0 through i to inputs 14 of the cell array 12, or to corresponding inputs of a second-decoder 20 which, in turn, connects to the cell array 12. In accordance with the invention, however, the signal-directing circuit 50 is interposed between the outputs 56 from the pre-decoder 18 and the inputs 14 to the cell array 12.

If only one decoder is used to address the array 12, then the number of inputs, i, is equal to $2^N$. Otherwise, i is equal to $2^{N-X}$, where X is the number of bits that are provided to the final- or second decoder 20.

The pre-decoded outputs 56 are provided to both the fuse-cutting and line-select circuits 52, 54. A particular GWL(X) on output 56 is ordinarily conveyed as a row signal X to a corresponding row conductor 14 (GWL(X)'), in the absence of a defective cell D. Such signal conveyance would occur if the fuse 74 of that row or column signal, and the fuse 74 of all preceding row or column signals, were intact. Thus, a given GWL(X) on output 56 is conveyed by the signal-directing circuit 50 via output A of the line-select circuit 54 onto the same row conductor 14, namely, GWL(X)'. However, if a GWL(K) contains a defective cell D, then the fuse-cutting circuit 52 may be used to select output B of the line-select circuit 54 and thereby direct the GWL(K) to the row conductor 14 of GWL(K+1). Such signal conveyance would occur if the fuse 74 of that row or column signal were melted, or if the fuse 74 of any preceding row or column signal were melted.

The fuse-cutting circuits 52 provide select-A and select-B signals on lines 58, 60, respectively, for selecting between outputs A and B. The select-A and select-B signals are preferably complements of one another so that one can be derived from the other. In addition, a cut-fuse signal 62 is provided to a logic gate which serves as a cut-fuse signal generator (see AND gate 80) to electrically inform a succeeding row X+1 of the status of the fuse of row X by way of signals indicative of the condition of the fuse 74 of row X. If the fuse 74 of row X has been melted, the cut-fuse signal generator provides a signal indicative of the melted condition of fuse 74 of row X (at the output of AND gate 80 of row or column X) to the signal-directing circuit 50 of the succeeding row or column X+1 (at the input of AND gate 80 of row or column X+1). This further signal indicative of the condition of the fuse 74 from a preceding stage causes the line-select circuit 54 of each succeeding row or column to select output B.

The cut-fuse signal 62 has a first value when the fuse is intact and a second value when the fuse is melted (opened). Thus, if the $K^{th}$ row signal addresses a row containing a defective cell, the fuse-cutting circuit 52 may direct the GWL(K)$^{th}$ output 56 to the GWL(K+1)$^{th}$ row conductor 14, as described above, while the cut-fuse signal 62, by way of the cut-fuse signal generator 80, directs the line-select circuits associated with the succeeding GWL(K+1) through the GWL(i)$^{th}$ outputs 56 to appear on the GWL(K+2)$^{th}$ through GWL(i+1)$^{th}$ row conductors 14, respectively. In other words, the row signals for the defective cell and each successively higher row signal will be directed to sequentially higher address locations in the array except for the last row signal, with the last row signal addressing the address locations of the redundant array.

Thus, when a defective cell is located in at least a row or column location K, the $K^{th}$ fuse may be melted to cause at least one of the row or column signals K through $(i-1)^{th}$ to be directed by the signal-directing circuit to row or column address locations K+1 through i, where i is the highest number row or column address location in the array. Further, the signal-directing circuit directs the $i^{th}$ row or column signal to a row or column address location in the redundant array. In this situation, the signal-directing circuit directs the row or column signals 0 through $(K-1)^{th}$ to corresponding address locations in the array, that is, it does not redirect these signals.

The fuse-cutting circuit 52 of the embodiment shown in FIG. 3 comprises several features for each decoded line on which the aforementioned redundancy scheme is to be utilized. These features may be patterned and formed at the same time that the remaining features are formed on the memory chip 10.

With reference now to FIG. 3, a two-input AND gate 70 has its inputs connected to a row signal (GWL(X)) and to an enable line 72. In particular, rows (K-1), (K) and (i) are shown, the rows between K and i being omitted (see FIGS. 2A and 2B). The enable line 72 is normally low, but is brought to a logic high level (for example, 1.7 to 5 volts) when a fuse 74 is to be cut. The output of the AND gate 70 drives the gate of a MOS field-effect transistor (MOSFET) 76. The source of the MOSFET 76 is grounded and the drain is connected to a logic high level provided by a voltage source $V_{DD}$ through the fuse 74. The MOSFET 76, so arranged, serves as a current source which, when conducting, provides a current sufficient to cause the fuse 74 to melt. An impedance such as resistor 78 protects the remaining circuitry of the fuse-cutting circuit 52 while current is flowing through the fuse 74, that is, while the MOSFET 76 is in a conducting state. The AND gate 70, MOSFET 76, and fuse 74 constitute a fuse-programming circuit.

Because the enable signal on the enable line 72 is normally low, the output of the AND gate 70 also is normally low and so the MOSFET 76 is ordinarily in a non-conducting state. Consequently, the voltage $V_{DD}$ appears at a node N1 via the unmelted fuse 74. One end of the resistor 78 is electrically connected to the node N1 and the second end is connected to an input 86 of a two-input AND gate 80. The resistor 78 has a value selected so that the voltage appearing at the AND gate 80 is interpreted as a logic high level when the fuse 74 in not melted. The second input 88 of the AND gate 80 is connected to the cut-fuse line 62.

The output of the AND gate 80 is the line 58 which provides the select-A signal to the line-select circuit 54. This output also serves as the cut-fuse line 62 for the next row signal. An inverter 82 has its input connected to the output of the AND gate 80 and provides the select-B signal at its output on line 60 to the line-select circuit 54. The output of the inverter 82 is also connected to the gate of a MOSFET 84. The drain of the MOSFET 84 is connected to ground while the source is connected to the input 86 of the AND gate 80, adjacent the second end of the resistor 78.

Assuming that the cut-fuse line 62 of a given word line X-1 is at a logic high level (that is, the fuses of all preceding lines are intact), the output of the AND gate 80 of row X will also be at a logic high level if the fuse 74 of that word line is intact. As a result, select-A for row X will be at a logic high level. Also, the cut-fuse line 62 provided to the input 88 of the AND gate 80 of the next row, row X+1, will be at a logic high level. Further, the select-B will be at a logic low level, due to the action of the inverter 82, and MOSFET 84 will latch into an off state.

On the other hand, if a particular row K of the array 12 includes one or more defective storage cells, then an enable signal is applied to the enable line 72 while that row is addressed. The coincidence of these signals at the inputs of the AND gate 70 causes the MOSFET 76 to conduct current sufficient to melt the fuse 74 (see FIG. 3 in which the fuse 74 of row K is shown as open). The input 86 of the AND gate 80 is thereby disconnected from a logic high input. As a result, the select-A signal on line 58 switches to a logic low level (that is, it becomes a bypass output A signal or "bypass signal") and the select-B signal on line 60 switches to a logic high level. This in turn causes the MOSFET 84 to conduct.

The conducting MOSFET 84 clamps the input 86 of the AND gate 80 to ground potential. Because one input of the AND gate 80 is clamped to ground potential, the cut-fuse line 62 provided to the input 88 of the AND gate 80 of the next row K+1 is also at ground potential. With the input 88 of the AND gate 80 being at ground potential, select-B will be high for each of the succeeding rows regardless of whether the fuse 74 of such rows is intact. Consequently, the present invention permits a downward (or sideways, in the case of columns) shift of rows (or columns) from the $K^{th}$ row to the $i^{th}$ row without any need for reprogramming a read only memory or other device. Rather, a single cut fuse avoids a row (or column) K having at least one defective cell D by instead directing the data to address locations in other rows (or columns) of the cell array 12 and also to address locations in the redundant array. As a consequence, a row K having a defective cell D will not be utilized.

A circuit which may be used to implement the line-select circuits 54 according to the invention is also shown in FIG. 3. The circuit preferably comprises two pairs of cascaded n- and p-channel transistors. Connected between the outputs 56 of the pre-decoder 18 and output A is a cascaded p-channel transistor 90 and an n-channel transistor 92. Similarly, connected between the pre-decoded outputs 56 and output B is a cascaded p-channel transistor 94 and an n-channel transistor 96. The source terminals of the transistors 90, 92, 94, 96 are commonly connected to the output 56. The drain terminals of the transistors 90, 92 are connected to the output A and the drain terminals of the transistors 94, 96 are connected to the output B. The gate terminals of the transistors 92, 94 are connected to the select-A signal on line 58 whereas the gate terminals of the transistors 90 and 96 are connected to the select-B signal on line 60.

The foregoing circuit arrangement operates as follows. When the select-A signal has a logic high level, select-B has a logic low level. In this situation, transistors 90 and 92 are turned on and are conductive whereas transistors 94 and 96 are turned off and are non-conductive. As a result, a given row or column signal X from the pre-decoder 18 will be directed to output A and to a corresponding row or column X of the array 12. On the other hand, when the select-A signal has a logic low level, select-B has a logic high level which instead causes the transistors 94 and 96 to conduct and transistors 90, 92 to stop conducting. Consequently, the row or column signal X will be directed to output B and to row or column X+1 of the array 12 (see FIGS. 2A and 2B).

Much of the foregoing discussion can be appreciated from the following Table in which X represents an arbitrary row in the array 12, K represents a particular row in the array 12 which contains at least one a defective cell D, and i represents the highest number row or column address location in the array 12. Cut-fuse, select-A, and select-B are the signals on lines 62, 58, and 60, respectively. Line 14 (Output) is the line of the array 12 to which a particular output 56 is directed by the signal-directing circuit 50.

TABLE

| Output 56 | Cut-fuse Line 62 | Select-A | Select-B | Line 14 (Output) |
|---|---|---|---|---|
| GWL(0) | N/A | 1 | 0 | GWL(0)' |
| GWL(1) | 1 | 1 | 0 | GWL(1)' |
| GWL(2) | 1 | 1 | 0 | GWL(2)' |
| GWL(X − 1) | 1 | 1 | 0 | GWL(X − 1)' |
| GWL(X) | 1 | 1 | 0 | GWL(X)' |
| GWL(X + 1) | 1 | 1 | 0 | GWL(X + 1)' |
| GWL(K − 1) | 1 | 1 | 0 | GWL(K − 1)' |
| GWL(K) | 1 | 0 | 1 | GWL(K + 1)' |
| GWL(K + 1) | 0 | 0 | 1 | GWL(K + 2)' |
| GWL(i − 1) | 0 | 0 | 1 | GWL(i)' |
| GWL(i) | 0 | 0 | 1 | GWL(i + 1)' |

From the table it should be appreciated that the fuse-cutting circuit 52 associated with the first row (GWL(0)) need not include the AND gate 80. Because no row precedes this row, there does not exist a cut-fuse line 62 which can be connected to the input 88 of the AND gate 80. Alternatively, the AND gate 80 may be provided so long as the input 88 is connected to a logic high level (for example, a voltage source) instead of the cut-fuse line 62. Either arrangement is equivalent because the select-A and select-B signals on lines 58 and 60 will be the same, but the cut-fuse signal is not applicable to row GWL(0) in the way it applies to the remaining rows.

It should also be appreciated from the above table that because row K contains the defective cell D, the row K fuse is melted and this causes select-A to go low and select-B to go high. Further, the cut-fuse line 62 will only be at a logic low level if a fuse of a preceding row has been melted. Thus, the melting of the fuse in row K causes the cut-fuse lines 62 of rows K+1 through i to be at a logic low level. Therefore, regardless of the condition of the fuses 74 of rows K+1 through i, one input 88 of the two-input AND gate 80 will be low and the select-B signal will be high. Finally, it should be understood that if the fuse 74 of any of the rows 0 through i is cut, the $i^{th}$ row will be stored in the redundant array because that row will be shifted to a location beyond the last row of the array 12. This shifting is transparent to the decoding logic.

A single decoding stage can be used to decode the bits assigned to the rows, columns, or both. This requires a single cell array 12 (FIG. 1) to be used to accommodate the data to be stored (e.g., 1 megabit) and permits only a single row or column of defective cells to be repaired by the circuitry shown generally in FIGS. 2A, 2B and 3. The use of second decoding circuits permits, but does not necessitate, a selection from among plural cell subarrays 12' (for example, four subarrays of 262,144 bits rather than one array of 1,048,576) and therefore provides more flexibility in designing the layout of the chip. Such an arrangement is shown in FIG. 4 which illustrates the signal-directing circuit 50, described above, implemented on the pitch of the column, that is, as a column of cells parallel to the column conductors 16.

Figure 4:
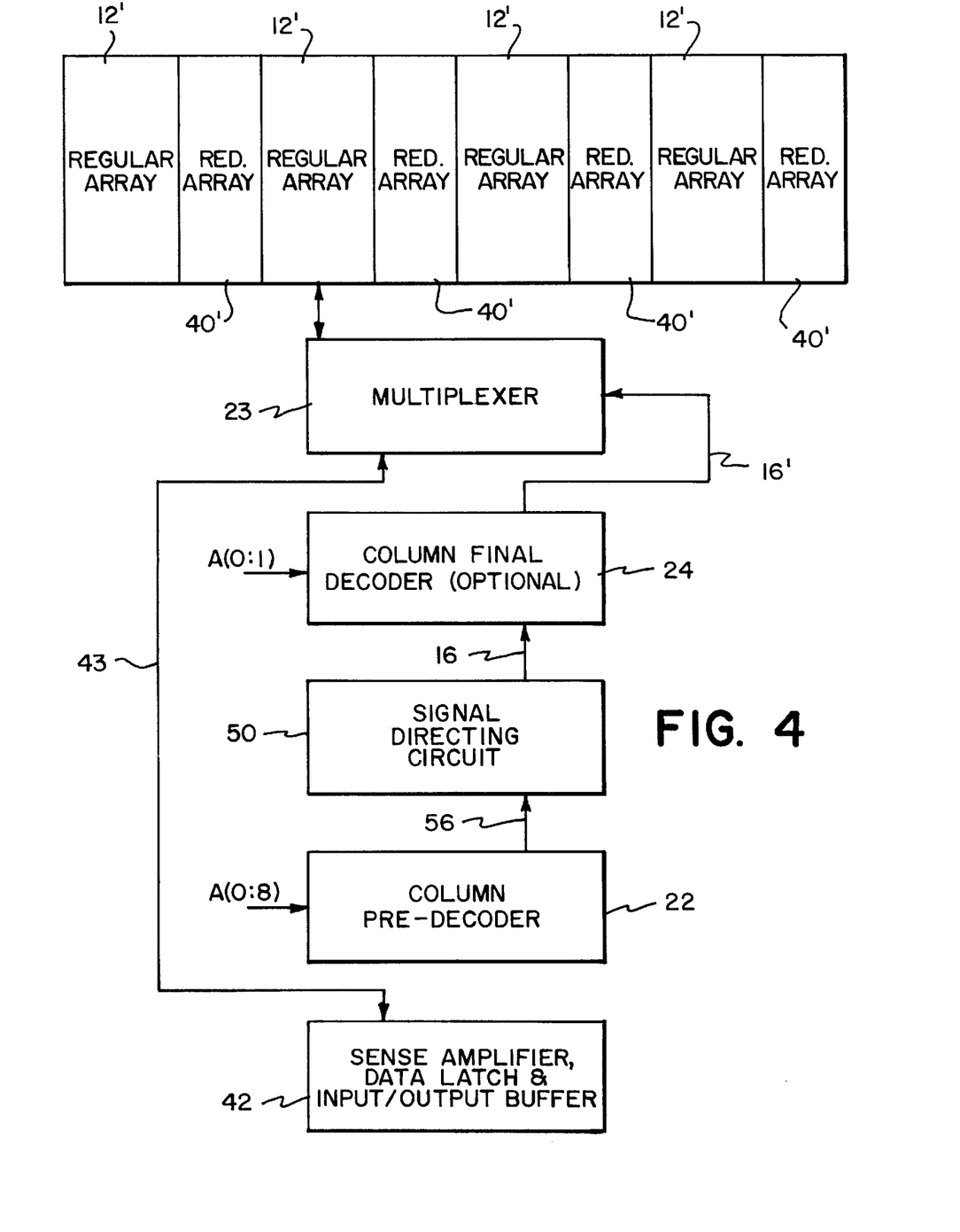
FIG. 4 shows in simplified block diagram form the layout of a second application of the signal-directing circuit of the present invention connected between a decoding circuit, plural cell arrays, and plural redundant arrays.

In FIG. 4, the n-bit address supplied by MAR 26 includes address bits which have been assigned to the rows and columns. For discussion purposes only, ten bits A9–A0 have been assigned for the column address; the number of bits assigned to the row address is not specified, but may be, for example, ten bits to constitute a one megabit memory chip. It should be understood that an arbitrary number of bits may be assigned to the row and column addresses. The eight most significant bits A8 . . . A2 (C-MSB) are input to the pre-decoder 22. The two least significant bits A1 and A0 (C-LSB) are input to the final-decoder 24 and provide for the selection among the plural arrays 12'. The C-LSBs are decoded and logically ANDed with the column signals on column conductors 16 from the signal-directing circuit 50. The decoded C-LSBs enable a selection between four subarrays 12' because two bits are being decoded. The selected subarray is addressed via column signals on column conductors 16'. If any one of the subarrays 12' includes a defective cell D, the signal directing circuit 50 may be utilized as above to substitute a redundant column of cells from the redundant array 40' associated with that subarray 12'.

In the context of this application of the present invention, a column with defective cell D in any of the subarrays 12' can be supplanted by a column of cells from its associated redundant array 40', and so the use of subarrays 12' permits the repair of multiple defective cells D, that is, a single column in each of the subarrays 12'. The redundant array could also be arranged to include a redundant row in addition or instead of the redundant columns. Further, plural subarrays 12' may be more easy to layout on a chip than a single array 12 having the same total number of storage cells as the sum of the subarrays 12'. The embodiment of FIG. 4 illustrates physically contiguous cell arrays 12' each having a redundant array containing a column of storage cells. The logical division of the array 12 is due to the second decoding stage, which selects among the various subarrays 12'.

While FIG. 4 illustrates two bits being provided to the final-decoder 24, providing a different number of bits to the final-decoding stage will result in a different number of subarrays 12'. In particular, if one bit is provided to the final-decoding stage 24, then the status of that bit (zero or one) will select between two (2¹) subarrays 12' and a defective cell D in either or both subarrays 12' may be repaired. Similarly, if three bits are provided to the final-decoding stage 24, then those bits select between eight (2³) subarrays 12' and defective cells D in any or all of the subarrays 12' may be repaired. In general, plural subarrays 12' may be provided when one or more bits are sent to a final-decoder.

Because each of the features of the fuse-cutting and line-select circuits 52, 54 can be implemented as FET devices, wires, or resistive elements (the AND gates are composed of a series of FETs), the entire signal-directing circuit can be scaled along with the surrounding memory. Further, the signal directing circuit 50 can be formed parallel to either the rows or columns which enables the present invention to be manufactured in a compact, layout-efficient format.

While MOSFETS have been described as the preferred FET, other devices may be used, such as insulated gate FETs (IGFET), complementary metal oxide FETs (CMOS) or other electronic devices.

Other circuits based on logic gates (AND and OR) can be constructed to achieve the same selection between outputs A and B. The aforementioned design is preferred, however, because it can be constructed from fewer transistors (four in total as compared to twenty-four, if AND gates are used).

FIGS. 2A, 2B and 3 particularly describe the signal-directing circuit 50 with reference to the row address signals on lines 14 (the rows or global word lines) whereas FIG. 4 describes the signal-directing circuit 50 operating in substantially the same, if not identical, manner in directing signals onto certain ones of the column address signals on lines 16 (the columns or bit lines). The foregoing description is merely intended to illustrate two distinct applications of the claimed invention, one in which row signals are used by the signal-directing circuit and another in which column signals are used by the signal-directing circuit. A hybrid approach can be implemented as well, as indicated in FIG. 1.

Further, while not being a preferred mode, it should be understood that the fuses 74 may be melted using a laser instead of a transistor-based device such as a current source.

The redundant array 40, 40' may be formed parallel to either the rows or columns, in which case the array would be a one-dimensional row array or column array, respectively. Alternatively, the redundant array 40, 40' may include addressable locations which are formed parallel to both each of the rows and columns.

The memory device of my present invention provides the capability of replacing defective elements (for example, storage cells) on a semiconductor chip without the need to physically locate a fusible link associated with the corrupt cell on the wafer. Rather, repair is effected by electrical programming which can be achieved on a packaged device or while the device is still on a wafer. In the illustrative embodiments, the repair requires only one fuse link to be cut and there is typically no speed penalty resulting from the repair because static logic is used to shift the row or column address signals of the array around the defective row or column. This results in reduced manufacturing costs. Also, by improving the yield of good chips, it results in an earlier introduction of new products on existing wafer fabrication lines and in new process technologies. Further, the signal-directing circuit of my present invention may be reduced in its surface dimensions ("scaled") along with the remaining elements of the circuit, which is an important consideration in the development and manufacture of submicron technologies.

While the invention has been particularly shown and described with reference to the preferred embodiments thereof, it will be understood by those skilled in the art that various changes in form and detail may be made therein without departing from the spirit and scope of the invention.

What is claimed:

1. An integrated circuit including a memory having an array of data storage cells arranged at addressable row and column locations which are addressed by row and column signals decoded from an n-bit address signal, comprising:

a redundant array of addressable data storage cells; and signal-directing means responsive to a defective cell in the array for (a) directing at least one of the row and column signals which address the defective cell and each successively higher row or column signal up to the next to the last row or column signal to sequentially higher address locations in said array, and (b) directing the last row or column signal to said redundant array.

2. The integrated circuit as in claim 1, wherein said defective cell is located at least one of a row or column location K, whereby the signal-directing means (a) directs at least one of the row or column signals K through i−1 to row or column address locations K+1 through i, where i is the highest number row or column address location in the array, and (b) directs the $i^{th}$ row or column signal to a row or column address location in the redundant array.

3. The integrated circuit as in claim 2, wherein said signal-directing means has a fuse associated with each line, said signal-directing means directing the row or column signals K through i when said fuse of the $K^{th}$ row or column signal is open.

4. The integrated circuit as in claim 3, wherein said signal-directing means includes a means responsive to the coincidence of an enable signal and the row or column signal K to open said fuse of the $K^{th}$ line.

5. The integrated circuit as in claim 2, wherein said signal-directing means directs the 0 through $(K-1)^{th}$ row or column signals to corresponding address locations in said array.

6. The integrated circuit as in claim 1, wherein said redundant array is one-dimensional and is one of a row array and a column array.

7. The integrated circuit as in claim 1, wherein said redundant array is physically contiguous to said array.

8. An integrated circuit including a memory having plural arrays of data storage cells arranged at addressable row and column locations which are addressed by row and column signals decoded from an n-bit address signal by a decoding circuit, said decoding circuit selecting one of said plural arrays, comprising:

a redundant array of addressable data storage cells associated with each of said plural arrays; and signal-directing means associated with each of said plural arrays and responsive to a defective cell in said selected array for (a) directing at least one of the row and column signals which address the defective cell and each successively higher row or column signal up to the next to the last row or column signal of said selected array to sequentially higher address locations in said selected array, and (b) directing the last row or column signal of said selected array to the redundant array associated with said selected array.

9. The integrated circuit as in claim 8, wherein said defective cell is located at least one of a row or column location K of the selected array, whereby the signal-directing means (a) directs at least one of the row or column signals K through i−1 to row or column address locations K+1 through i, where i is the highest number row or column address location in the selected array and (b) directs the $i^{th}$ row or column signal to a row or column address location of that redundant array associated with said selected array.

10. The integrated circuit as in claim 9, wherein said signal-directing means has a fuse associated with each line, said signal-directing means redirecting the row or column signals K through i when said fuse of the $K^{th}$ row or column signal is open.

11. The integrated circuit as in claim 10, wherein said signal-directing means includes a means responsive to the coincidence of an enable signal and the row or column signal K to open said fuse of the $K^{th}$ line.

12. The integrated circuit as in claim 9, wherein said signal-directing means directs the 0 through (K−1) row or column signals to corresponding address locations in said selected array.

13. The integrated circuit as in claim 8, wherein each of said redundant arrays is one-dimensional and is one of a row array and a column array.

14. The integrated circuit as in claim 8, wherein each of said redundant arrays is physically contiguous to said plural array with which it is associated.

\* \* \* \* \*